United States Patent
Matsuoka et al.

(10) Patent No.: US 6,255,409 B1
(45) Date of Patent: Jul. 3, 2001

(54) EPOXY RESIN COMPOSITION AND RESIN-ENCAPSULATED SEMICONDUCTOR DEVICE

(75) Inventors: Yoshiki Matsuoka, Ibaraki; Yasuhiro Hirano, Chiba; Nobuyuki Nakajima, Ibaraki, all of (JP)

(73) Assignee: Sumitomo Chemical Co., Ltd., Osaka (JP)

(*) Notice: Subject to any disclaimer, the term of this patent is extended or adjusted under 35 U.S.C. 154(b) by 0 days.

(21) Appl. No.: 09/266,736

(22) Filed: Mar. 12, 1999

(30) Foreign Application Priority Data

Mar. 13, 1998 (JP) .................................... 10-063304
Apr. 23, 1998 (JP) .................................... 10-113288

(51) Int. Cl.$^7$ .............................. C08G 59/14; H01L 23/29
(52) U.S. Cl. .................... 525/524; 525/526; 523/427; 257/793
(58) Field of Search .................................. 525/524, 526; 523/427; 257/793

(56) References Cited

U.S. PATENT DOCUMENTS

| | | | |
|---|---|---|---|
| 5,206,313 | * | 4/1993 | Ono et al. ............................. 525/524 |
| 5,414,058 | * | 5/1995 | Ono et al. ............................. 525/524 |
| 5,641,840 | * | 6/1997 | Tsuchida et al. ...................... 525/524 |
| 5,969,060 | * | 10/1999 | Arai ...................................... 525/524 |
| 6,063,876 | * | 5/2000 | Hayakawa et al. .................. 525/524 |

FOREIGN PATENT DOCUMENTS

| | | |
|---|---|---|
| 0 507 271 A2 | 10/1992 | (EP) . |
| 0 511 833 A2 | 11/1992 | (EP) . |
| 0 620 238 A2 | 10/1994 | (EP) . |
| 0 869 140 A2 | 10/1998 | (EP) . |
| 2-300255 | 12/1990 | (JP) . |
| 4-198211 | 7/1992 | (JP) . |

OTHER PUBLICATIONS

Patent Abstract of Japan, of JP 05–206329 A, vol. 017, No. 640 (E–1465) Aug. 13. 1993.

* cited by examiner

Primary Examiner—Philip Tucker
(74) Attorney, Agent, or Firm—Pillsbury Winthrop LLP

(57) ABSTRACT

An epoxy resin composition comprising (A) a bifunctional crystalline epoxy compound, (B) an amorphous trisphenol-methane type epoxy compound having three or more of epoxy groups in a molecule, and (C) an epoxy curing agent having phenolic hydroxyl groups. The resin composition has an excellent moldability (low viscosity and can be filled with filler with high density) and high softening point, and is used preferably as an encapsulating material for electronic device.

10 Claims, No Drawings

EPOXY RESIN COMPOSITION AND RESIN-ENCAPSULATED SEMICONDUCTOR DEVICE

BACKGROUND OF THE INVENTION

1. Field of the Invention

The present invention relates to an epoxy resin composition which is useful for adhesives, paints and electric/electronic materials(e.g. insulation materials, laminated plate, etc.), particularly useful for encapsulating electric devices.

2. Description of the Related Art

Recently, for encapsulating semiconductors such as LSI, IC, transistor and the like, transfer mold of an economically useful epoxy resin composition is conducted.

Particularly, surface mounting of LSI is recently conducted, and direct immersion into a solder bath is increasing. Since an encapsulating material is exposed to a high temperature of above 200° C. in this treatment, moisture absorbed in the encapsulating material expands, crack is formed in the material, and peeling occurs at interface with a die pat.

Therefore, the epoxy resin encapsulant is required to have properties of low moisture absorption, high crack resistance and improved adhesion. Further, for a purpose of obtaining a low moisture absorption property, an epoxy resin of low viscosity in which a filler can be filled in high concentration is desired. Currently, an encapsulating material in which glycidyl ether of o-cresol novolak is used as a polyfunctional epoxy resin and phenol novolak is used as a curing agent is mainly used, however, when the encapsulating material absorbs moisture in storage, the above-described problems occur. Therefore, for avoiding these problems, the encapsulating material is wrapped for preventing moisture absorption in practical use.

On the other hand, a biphenyl type epoxy resin in current use has a lower viscosity and can contain a filler in higher concentration than a polyfunctional epoxy resin, since the biphenyl epoxy resin is a bifunctional epoxy resin and has a low molecular weight. Therefore, moisture absorption depending on the biphenyl type epoxy resin can be reduced as whole package and strength thereof can be increased, consequently, excellent crack resistance can be obtained as compared with an epoxy resin in the form of a glycidyl ether of o-cresol novolak. However, the biphenyl type epoxy resin has problem that molding property of a cured article thereof is low as compared with the polyfunctional epoxy resin.

Furthermore, the softening point of an amorphous epoxy resin having a low melt viscosity is generally low, and there have been problems of blocking at the time of storage to deteriorate the workability. Therefore, the amorphous resin is stored generally with cooling in a refrigerator, and the productive efficiency is bad and not economical.

There has been a proposal of using a bisphenol compound of α-methylstilbene as an encapsulating material (for example, JP-A-6-345849). However, the epoxy compound disclosed there is not sufficient in moldability etc.

An object of the present invention is to provide an epoxy resin composition which has an excellent moldability (low viscosity and can be filled with filler with high density) and high softening point, and hardly causes blocking during storage.

SUMMARY OF THE INVENTION

The present invention is as follows.

[1] An epoxy resin composition comprising (A) a bifunctional crystalline epoxy compound, (B) an amorphous trisphenolmethane type epoxy compound having three or more of epoxy groups in a molecule, and (C) an epoxy curing agent having phenolic hydroxyl groups.

[2] An epoxy resin composition comprising (A) a bifunctional crystalline epoxy compound, and (B) an amorphous trisphenolmethane type epoxy compound having three or more of epoxy groups in a molecule, wherein the whole or a part of epoxy compound (A) is dispersed in epoxy compound (B) as crystallites.

The epoxy compound (A) used for the present invention is a bifunctional crystalline epoxy compound, and suitably a compound represented by the general formula (1).

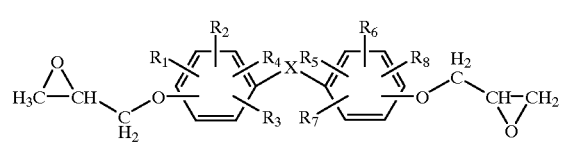

(1)

Here, X represents —N=N—, —CH=C(R$_9$)—, —O—CO—, —CH=C) (CN)—, —C≡C—, —CH=CH—CO— or a single bond. R$_1$ to R$_9$ represent each independently an acyclic or cyclic alkyl group having 1–6 carbon atoms, a hydrogen atom or a halogen atom. More suitably, X is —CH=C(R$_9$)—.

Concrete examples of substituents R$_1$–R$_9$ of the epoxy compound represented by the general formula (1) include methyl group, ethyl group, propyl group, butyl group, amyl group, hexyl group, cyclohexyl group, phenyl group, tolyl group, xylyl group (each isomer is included), chlorine atom, bromine atom, etc.

In the general formula (1), glycidyl ether of stilbene bisphenol whose X is —CH=C (R$_9$)— can be obtained by a known method of glycidyl etherification of a stilbene bisphenol.

As for a producing method of stilbene bisphenol compound used as a raw material for epoxy compound, a reference (von Rolf H. Sieber, Liebigs Ann. Chem. 730, 31–46 (1969)) discloses a preparation method and physical properties of the compound, such as 4,4'-dihydroxystilbene, 4,4'-dihydroxy-3,3'-dimethylstilbene and 4,4'-dihydroxy-3,3',5,5'-tetramethylstilbene.

On the other hand, bisphenol compound of α-methylstilbene is also known, and for example, METHODEN DER ORGANISCHEN CHEMIE (HOUBEN-WEYL) BAND IV/1c Phenol Teil2 P1034 describes a preparation method of 4,4'-dihydroxy-α-methylstilbene from phenol and chloroacetone as starting materials.

Concrete examples of stilbene phenol used as a raw material include: 4,4'-dihydroxy-3-methylstilbene, 4,4'-dihydroxy-3-ethylstilbene, 4,4'-dihydroxy-3-propylstilbene, 4,4'-dihydroxy-3-amylstilbene, 4,4'-dihydroxy-3-hexylstilbene, 4,4'-dihydroxy-2,3-dimethylstilbene, 4,4'-dihydroxy-2,6-dimethylstilbene, 4,4'-dihydroxy-2,3'-dimethylstilbene, 4,4'-dihydroxy-3,3',5-trimethylstilbene, 4,4'-dihydroxy-2',3,5-trimethylstilbene, 4,4'-dihydroxy-2',3,3',5-tetramethylstilbene, 4,4'-dihydroxy-2',3,5,6'-tetramethylstilbene, 3-t-butyl-4,4'-dihydroxy-3'-methylstilbene, 3-t-butyl-4,4'-dihydroxy-5,3'-dimethylstilbene, 3-t-butyl-4,4'-dihydroxy-3',6- dimethylstilbene, 3-t-butyl-4,4'-dihydroxy-5-ethyl-3'-methylstilbene, 3-t-butyl-4,4'-dihydroxy-3'-methyl-5-propylstilbene, 3-t-butyl-4,4'-dihydroxy-5-butyl-3'-methylstilbene, 3-t-butyl-4,4'-dihydroxy-5-amyl-3'-methylstilbene, 3-t-butyl-4,4'-dihydroxy-5-hexyl-3'-methylstilbene, 3-t-butyl-4,4'-dihydroxy-5-cyclohexyl-3'-methylstilbene, 3-t-butyl-4,4'-dihydroxy-3',5,5'-trimethylstilbene, 3-t-butyl-2,4'-dihydroxy-3',5',6-trimethylstilbene, 3-t-butyl-4,4'-dihydroxy-3',5',6-trimethylstilbene, 3-t-butyl-4,4'-dihydroxy- 3',5,-dimethyl-5'-propylstilbene, 3-t-butyl-4,4'-dihydroxy-3',6,-dimethyl-5'-propylstilbene, 4,4'-dihydroxy-3,3'-dimethylstilbene, 3,3'-diethyl-4,4'-dihydroxystilbene, 4,4'-dihydroxy-3,3'-dipropylstilbene, 3,3'-diamyl-4,4'-dihydroxystilbene, 3,3'-dihexyl-4,4'-dihydroxystilbene, 3,3'-dicyclo hexyl-4,4'-dihydroxystilbene, 2,2'-dihydroxy-3,3', 5,5'-tetramethylstilbene, 4,4'-dihydroxy-3,3',5,5'-tetramethylstilbene, 4,4'-dihydroxy-3,3'-di-t-butylstilbene, 4,4'-dihydroxy-3,3'-di-t-butyl-5,5'-dimethylstilbene, 4,4'-dihydroxy-3,3'-di-t-butyl-6,6'-dimethylstilbene, 2,2'-dihydroxy-3,3'-di-t-butyl-6,6'-dimethylstilbene, 2,4'-dihydroxy-3,3'-di-t-butyl-6,6'-dimethylstilbene and 4,4'-dihydroxy-3,3',5,5'-tetra-t-butylstilbene. Isomers thereof having a substituent at a different position are also included.

Examples of α-methylstilbene include those having a methyl group on a carbon atom of carbon-carbon double bond of the above described stilbene compounds.

In view of easiness of preparation, performance and price of raw material, preferable stilbenes are: 2,2'-dihydroxy-3, 3',5,5'-tetramethylstilbene, 4,4'-dihydroxy-3,3',5,5'-tetramethylstilbene, 4,4'-dihydroxy-3,3',5,5'-tetramethyl-α-methylstilbene, 4,4'-dihydroxy-3,3'-di-t-butyl-5,5'-dimethylstilbene, 4,4'-dihydroxy-3,3'-di-t-butyl-6,6'-dimethylstilbene, 2,2'-dihydroxy-3,3'-di-t-butyl-6,6'-dimethylstilbene, 2,4'-dihydroxy- 3,3'-di-t-butyl-6,6'-dimethylstilbene, 3-t-butyl-4,4'-dihydroxy-3',5,5'-trimethylstilbene, 3-t-butyl-2,4'-dihydroxy-3',5',6-trimethylstilbene, and 3-t-butyl-4,4'-dihydroxy-3',5',6-trimethylstilbene.

Such bisphenol and epihalohydrin are made to react under existence of alkali, such as sodium hydroxide for glycidyl etherification. In order to obtain a highly pure material especially, a reaction under an aprotic solvent is preferable as described in JP-A 60-31517.

As other examples of crystalline epoxy compound, glycidyl ether of quinones such as 2,5-di-t-butylhydroquinone, glycidyl ether of dihydroxybiphenyls such as dihydroxytetramethylbiphenyl, and glycidyl ester of terephthalic acid are exemplified.

Component(A) used for the present invention is a bifunctional epoxy compound, which is dispersed in polyfunctional epoxy compound to reduce the melt viscosity without lowering the softening point. Examples thereof include crystalline epoxy compounds having two epoxy groups in a molecule, which has mesogen skelton or bisphenol skelton, without being limited. These epoxy compounds can be used as a mixture of two or more. Moreover, as for the melting point, it is suitably 80–150° C. from viewpoint of handling property.

As an amorphous trisphenolmethane type epoxy compound having three or more epoxy groups in a molecule, used in the epoxy resin composition of the present invention as an indispensable component(B), known compounds can be available. Examples thereof include: glycidyl ether compounds derived from phenols of trivalent or more, such as tris-(4-hydroxyphenyl)-methane, and 1,1,1-trishydroxyphenylethane; and glycidyl ether compounds of polyhydric phenols obtained by condensation reaction of phenols and aromatic carbonyl compounds. These can be used alone or in combination of two or more. These epoxy compound are preferably solid-like at a room temperature and have a softening point of not more than 100° C.

In the present invention, epoxy resin composition is obtained by mixing bifunctional epoxy compound (A) of general formula (1) and polyfunctional epoxy compound (B).

Since the polyfunctional epoxy compound(B) has itself a high melt viscosity, when much amount of filler is used, flow property of the whole resin composition will be spoiled at the time of melt-heating, moldability will become worse, gloss of cure-molded material surface will be lost, and sometimes unfilled portions will appear in a cured product.

By combining bifunctional epoxy compound (A) of general formula (1) and polyfunctional epoxy compound (B), high amount of filler containing can be attained easily which was difficult by using a polyfunctional epoxy alone, and cured product having good moldability can also be obtained.

Moreover, it is useful to disperse bifunctional epoxy compound (A) in polyfunctional epoxy compound (B) beforehand from viewpoint of handling properties.

As long as the composition has a desirably high softening temperature, the dispersion state is not especially limited, but uniformly dispersed state is preferable.

The size of domain of bifunctional epoxy compound is suitably 100 μm or less, and more suitably 50 μm or less. When the size of domain is larger then the above range, dispersion unevenness occurs or mixing property of bifunctional epoxy compound and polyfunctional epoxy compound falls down to result poor moldability, sometimes.

Especially when a crystalline epoxy compound is used as a bifunctional epoxy compound, and an amorphous epoxy compound is used as a polyfunctional epoxy compound, the effect of the present invention is attained preferably.

In this case, the domain of the bifunctional epoxy compound formed in the polyfunctional epoxy compound consists of crystallites of the bifunctional epoxy compound.

Method of manufacturing epoxy resin composition of the present invention will not be limited as long as the composition has a state where the whole or a part of bifunctional epoxy compound is dispersed in polyfunctional epoxy compound, and melt-mixing method or solvent mixing method are exemplified. The former method is preferable in view of a practical use, and explained in detail below.

In order to obtain an epoxy resin composition of the present invention by melt-mixing, the component ratio of the composition and the temperature at the time of mixing are important. The amount of bifunctional epoxy compound is 0.1% by weight or more, suitably 0.5% by weight or more, more suitably 1.0% by weight or more in the whole of the composition. When the amount is less than the above range, the reducing effect of the viscosity of the whole resin is small and it may become difficult to make a state where the whole or a part of bifunctional epoxy compound is dispersed in a polyfunctional epoxy compound.

Melt viscosity at 150° C. (ICI viscosity) of the resin composition of the present invention is suitably 2.0 (P) or less, and more suitably 1.5 (P) or less.

Softening point of the resin composition is suitably 40° C. or more, and more suitably 50° C. or more.

When a crystalline epoxy compound is used as a bifunctional epoxy compound, since deposition of crystal can be utilized, it is possible to form more stable domain compared with when an amorphous epoxy compound is used as a bifunctional epoxy compound, and the effects of improving the softening point of the composition and reducing the melt-viscosity are large.

As for the mixing temperature, one method is mixing with heating at a temperature not lower than the softening point of the polyfunctional epoxy compound and lower than the melting point of the bifunctional epoxy compound. In this method, the mixing temperature is preferably lower than the melting point of the bifunctional epoxy compound by 10–30° C.

When the mixing temperature is higher than the above range, the amount of bifunctional epoxy compound exists as a domain in the polyfunctional epoxy compound becomes low, and it is not preferable. When the mixing temperature is lower than the above range, much energy is required for kneading, and it is industrially disadvantageous.

When a crystalline epoxy compound is used as a bifunctional epoxy compound, following method utilizing crystal deposition can be used.

Kneading is conducted at a temperature higher than melting point of crystalline epoxy compound to prepare resin composition having uniform phase structure where both amorphous epoxy compound and crystalline epoxy compound mixed, then, kneading is again conducted at a temperature around the softening point of amorphous epoxy compound and lower than the melting point of crystalline epoxy compound, and crystallite of crystalline epoxy compound can be dispersed uniformly in an amorphous epoxy compound.

Although this temperature may be higher than the softening point of amorphous epoxy compound, since a part of crystalline epoxy compound exists as dissolved in amorphous epoxy compound and lowers the softening point of amorphous epoxy compound, it is preferable to set the of crystal deposition/dispersion temperature around the softening point with considering such a situation.

Kneading can be conducted after cooling the composition below the melting point of the crystalline epoxy compound, as well as with cooling below melting point of the crystalline epoxy compound. A mixer, a two-roll mill, an extruder, etc. are used for the manufacturing methods.

Although dispersion state of the domain in the resin composition of the present invention can be observed with eye, preferably by an electron microscope. When the domain consists of crystallite, polarizing microscope and DSC measurement are also useful means.

Suitable amount of component A is 0.1% by weight or more and 80% by weight or less based on total weight of component A and component B which are an epoxy resin components. When the amount is below this range, improving effect of moldability is low, and when the amount is more than the range, further improvement of moldability may not be obtained.

The amount is more suitably 0.5% by weight or more and 70% by weight or less, and further suitably 1% by weight or more and 60% by weight or less.

Melt viscosity at 150° C. of epoxy compound (A) is suitably lower than 1 poise, and more suitably lower than 0.5 poise. It is besides suitable if it is less than 0.5 more poises.

Melt viscosity at 150° C. of polyfunctional epoxy compound (B) is suitably lower than 10 poise, and more suitably lower than 5 poise.

As an epoxy resin curing agent (C) used in the present invention, known curing agents can be used, and polyhydric phenol is suitably used from the point of moisture resistance.

Examples of polyhydric phenol include: polycondensation product of phenols such as phenol, various kind of alkyl phenols and naphthol with aldehydes such as formaldehyde, acetaldehyde, acrolein, glyoxal, benzaldehyde, naphthoaldehyde and hydroxy benzaldehyde, or ketones such as cyclohexanone and acetophenone; vinyl polymerization type polyhydric phenol such as polyvinylphenol and polyisopropenyl phenol; reaction products of phenols with diol compounds represented by formula (3)

(3)

dialkoxy compounds represented by formula (4)

(4)

(in the formula, R represents acyclic of carbon number 1–6 or cyclic alkyl group, and substituted or non-substituted phenyl group), and dihalogen compounds represented by formula (5)

(5)

(in the formula, X is halogen atom selected from fluorine, chlorine, bromine, and iodine); or Friedel-Crafts type reaction products of phenols with alicyclic compounds such as dicyclopentadiene and limonene, or diolefins such as diisopropenylbenzene. From the point of workability and hardenability, phenol novolak is preferable. These curing agents can be used alone or in combination of two or more.

Formulation ratio of the epoxy resin curing agent, is suitably 0.7 to 1.2 equivalent to epoxy group of the epoxy compound. When the ratio is less than 0.7 equivalents or more than 1.2 equivalents, curing does not proceed sufficiently enough sometimes.

For curing the epoxy resin composition of the present invention, well-known cure accelerators can be used. Examples of such a cure accelerator include: organic phosphine compounds such as triphenylphosphine, tri-4-methylphenyl phosphine, tri-4-methoxyphenylphosphine, tributylphosphine, trioctylphosphine, and tri-2-cyanoethylphosphine, and tetraphenylborate salts thereof; tertiary amine, such as tributylamine, triethylamine, 1,8-diazabicyclo(5,4,0)undecene-7, and triamyl mine; quarternary ammonium salts, such as chlorobenzyltrimethyl ammonium, hydroxybenzyltrimethyl ammonium, and triethylammonium tetraphenyl borate; and imidazols, without being limited to these. Among them, organic phosphine compound, 1,8-diazabicyclo(5,4,0) undecene-7, and imidazole are suitable from the point of moisture resistance and hardenability, and triphenylphosphine is especially preferable.

Examples of inorganic fillers (D) in the epoxy resin composition of the present invention include: silica, alumina, titanium white, aluminium hydroxide, talc, clay, glass fiber, etc., and silica and alumina are suitable. These can be mixed using different forms (spherical shape or crushed type) or sizes to increase the filling amount. The amount of the inorganic filler is suitably 40% by weight or more and 95% by weight or less in the whole resin composition, and more suitably, 50% by weight or more and 90% by weight or less. When the amount is less than 40% by weight, moisture resistance becomes inferior, and exceeding 95% by weight, moldability problem is generated.

In the epoxy resin composition of the present invention, there can be added mold lubricants such as natural wax, synthetic wax, higher fatty acid and its metal salts, or paraffin; colorants such as carbon black, or surface treatment agents, such as silane coupling agent, etc., according to requirements.

Furthermore, flame retardants, such as antimony trioxide, phosphorous compound, and brominated epoxy compound can be added. For flame retardant effect, brominated epoxy compound is especially preferable.

Further, for lowering stress, various elastomers may be added or previously reacted for use. Examples thereof include addition type or reaction type elastomers and the like such as polybutadiene, butadiene-acrylonitrile copolymer, silicone rubber, silicone oil and the like.

For encapsulating electronic parts such as a semiconductor and the like and producing a resin encapsulated semiconductor device using the epoxy resin composition of the present invention, curing-molding may advantageously be effected by a conventionally known molding method such as transfer mold, compression mold, injection mold and the like.

EXAMPLES

Although examples of the present invention are shown below, the present invention is not limited to these.

The evaluation methods of resin and cure-molded material are as follows.
Softening point: It was measured by ring and ball method, according to JIS K7234.

Spiral flow: It was measured under conditions of 175° C. and 70 kg/cm² according to EMMI-1-66.

Barcol hardness: It was measured under conditions of 175° C./90 seconds with using a 935 type hardness tester according to ASTMD-648.

Tg(glass transition temperature): It was measured using TMA.
Water absorption: Change in weight was measured under conditions of 85° C./60%RH using thermo-hygrostat (AGX-326 Advantech Toyo Corp.).

Bending physical properties: Three point bending test was conducted. Bending test at the time of heating was conducted In the examples, the epoxy equivalent is defined by molecular weight of an epoxy compound per one epoxy group.

Synthetic Example 1

Synthesis-1 of Raw Material Phenol

To a 2-liter four-necked flask equipped with a thermometer, stirrer and condenser were added 195.5 g (1.6 mol) of 2,6-xylenol (hereinafter, abbreviated as 26 XY), 65.7 g (0.4 mol) of 2-tertiarybutyl-5-methylphenol (hereinafter, abbreviated as 3M6B), 124.5 g (1.0 mol) of chloroacetoaldehyde dimethylacetal and 376 g of acetic acid, and the mixture was stirred for dissolution and cooled to 5° C. Then, to this was added dropwise a solution prepared by mixing 122 g (1.2 mol) of concentrated sulfuric acid with 84 g of acetic acid at 10° C. over 3 hours, then the reaction system was maintained at 250° C. for 6 hours, and stirring of the reaction system was continued overnight at room temperature. The temperature of the system was cooled to 5° C., and the precipitated crystal was separated by filtration. The crystal was washed with 500 g of water for six times, then dried under reduced pressure at 40° C. for 8 hours.

Synthetic Example 2

Synthesis of Raw Material Phenol-2

To a 2-liter four-necked flask equipped with a thermometer, stirrer and condenser were added 245.2 g of 48.3% aqueous sodium hydroxide solution and 552 g of N-methylpyrrolidone, and the inner atmosphere was replaced by nitrogen. Under nitrogen flow, the temperature of the solution was raised to 140° C. To this, was added dropwise 225.6 g of the phenol intermediate obtained in Synthetic Example 1 and 676 g of N-methylpyrrolidone solution at 140° C. for 1.5 hours and kept at that temperature for 2 hours. Then, the reaction mixture was cooled to 60° C. and neutralized with 226 g of concentrated hydrochloric acid. The solvent was recovered under reduced pressure, the reaction mixture was charged into 1000 g of ion-exchanged water, and the precipitated crystals were filtrated. The crystal was washed with water (1000 g×3 times) and dried under reduced pressure for 8 hours at 80° C., to obtain 208 g of ayellow crystal (stilbene bisphenol).

Synthetic Example 3

Synthesis of Epoxy Compound 100 g of stilbene bisphenol obtained in Synthetic Example 2 was charged into a reaction vessel equipped with a thermometer, stirrer, dropping funnel and condenser having a separation tube, and was dissolved in 485.6 g of epichlorohydrin and 243.1 g of dimehylsulfoxide. To this was added dropwise 61.71 g of 48.3% sodium hydroxide continuously at 48° C. with maintaining the inner pressure of the system at 43 torr. During this procedure, the system was reacted with maintaining the temperature at 48° C., cooling and liquefying epichlorohydrin and water azeotropically, and returning the organic layer back into the system. After completion of the reaction, unreacted epichlorohydrin was removed by concentration under reduced pressure, and the by-produced salt and glycidyl ether were dissolved in 644 g of methylisobutylketone, and the by-produced salt and dimethylsulfoxide were removed by washing with water. Then, methylisobutylketone was distilled off under reduced pressure of 10 torr at 160° C., to obtain a desired product.

The melting point was 110° C., using differential scanning calorimeter (Seiko Electronics Co.,Ltd., SSC5000 series, DSC200) measured under condition of temperature rising rate of 10° C./min. Here, the starting point of the endothermic peak of fusion was regarded as the melting point. This compound was 208 g/eq. of epoxy equivalent, 170 ppm of hydrolyzable chlorine, and 0.1 poise of melt viscosity at 150° C.

Example 1

The glycidylether obtained in Synthetic Example 3 (referred to as "epoxy 1", 208 g/eq of epoxy equivalent), triphenolmethane type glycidyl ether (referred to as "epoxy 2", 213 g/eq of epoxy equivalent, Sumiepoxy TMH574 manufactured by Sumitomo Chemical Co., Ltd.), phenol novolak (trade name: Tamanol 758, manufactured by Arakawa Kagaku Kogyo Corp.) as a curing agent, triphenylphosphine as a curing accelerator, fused silica (grade of the silica is shown below) as a filler, carnauba wax as a mold-releasing agent, and coupling agent (trade name: SH-6040, manufactured by Dow Corning Toray Silicone Co., Ltd.) were compounded in amounts (g) shown in Table 1, and the mixture was kneaded with heating by a roll, then subjected to transfer molding. As a filler, a material obtained by compounding 20% by weight of crushed silica FS891 (manufactured by Denki Kagaku Kogyo K. K.) with 80% by weight of fused silica FS20 (manufactured by Denki Kagaku Kogyo K.K.) was used.

Further, the molded article was subjected to post curing in an oven at 180° C. for 5 hours to obtain a cured molded article.

The physical properties of this cured molded article were measured, and the results are shown in Table 1. As a result, (1) flowability can be improved without lowering the softening point, (2) keeping mechanical properties as the same level of comparative Examples, elastic modulus is low at a high temperature (240° C.), and stress lowering is attained.

Thus, it is found out that the composition is very useful as a resin compositions for encapsulatings.

In the Table, the softening point is a softening point of epoxy composition where crystalline epoxy 1 is deposited in epoxy 2.

Comparative Example 1

Trisphenolmethane type epoxy compound (referred to as epoxy 3, 168 g/eq of epoxy equivalent), which was prepared by mixing salicylaldehyde and a phenol as starting materials was mixed as shown in Table 1, and after roll mixing, transfer molding was conducted.

Further, the molded article was subjected to post curing in an oven at 180° C. for 5 hours to obtain a cured molded article.

The physical properties of this cured molded article were measured.

TABLE 1

| | | Example 1 | Comparative Example 1 |
|---|---|---|---|
| Filler content (wt %) | | 84 | 82 |
| Formulation | Epoxy 1 | 50 | — |
| | Epoxy 2 | 50 | — |
| | Epoxy 3 | — | 100 |
| | Phenol novolak | 50.1 | 63.1 |
| | TPP | 1.5 | 1.5 |
| | SH-6040 | 2.0 | 2.0 |
| | Carnauba wax | 1.5 | 1.5 |
| | Fused silica 60 | 630.6 | 594.4 |
| | Crushed silica 891 | 157.6 | 148.6 |
| Softening point of resin (° C.) | | 90.7 | 48.0 |
| Spiral flow (inch) | | 30.6 | 29.6 |
| Barcol hardness | | 88 | 88 |
| Tg (° C.) | | 158.8 | 178.8 |
| Water absorption (168 hr, %) | | 0.195 | 0.263 |
| Bending property (room temp) | Strength (kg/mm$^2$) | 17.0 | 16.6 |
| | Flexural modulus (kg/mm$^2$) | 1811 | 1835 |
| | Deflection rate | $1.13 \times 10^{-2}$ | $1.04 \times 10^{-2}$ |

TABLE 1-continued

| | | Example 1 | Comparative Example 1 |
|---|---|---|---|
| Bending property (240° C.) | Strength (kg/mm$^2$) | 1.9 | 2.3 |
| | Flexural modulus (kg/mm$^2$) | 154.6 | 204.2 |
| | Deflection rate | $1.23 \times 10^{-2}$ | $1.04 \times 10^{-2}$ |

Example 2

As shown in Table 2, epoxy 1 as a crystalline epoxy compound and epoxy 2 as an amorphous epoxy compound were mixed, melt-mixed in a beaker at 150° C., and uniform resin composition was obtained. Then, this mixture was stirred on a hot plate heated at 80° C., and opaque resin composition was obtained.

As a result of DSC measurement (10° C./min) of this composition, endothermic peak was observed, and it was confirmed that epoxy 1 in epoxy 2 existed as crystal phase. Rate of crystallization of epoxy 1 was calculated as that 63% of adding amount exists as crystal phase.

Furthermore, ICI viscosity (@150° C.) and softening point of this resin composition were measured and shown in Table 1. Consequently, it became clear that the viscosity of the composition can be reduced, without softening point falling.

Example 3

Epoxy 1 and trisphenolmethane novolak type epoxy resin prepared from the mixture of salicylaldehyde and a phenol as astarting materials as an amorphous epoxy resin (referred to as "epoxy 3") were mixed as shown in Table 2, melt-mixed in a beaker at 150° C., and uniform resin composition was obtained. Then, this mixture was stirred on a hot plate heated at 50° C., and opaque resin composition was obtained.

ICI viscosity (@150° C.) and softening point of this resin composition were measured and shown in Table 2. Consequently, it became clear that the viscosity of the composition can be reduced, and the softening point was raised remarkably at the same time.

Example 4

Epoxy resin prepared from dihydroxytetramethylbiphenyl as a crystalline epoxy compound (referred to as "epoxy 4") and epoxy 2 were mixed as shown in Table 2, melt-mixed in a beaker at 150° C., and uniform resin composition was obtained. Then, this mixture was stirred on a hot plate heated at 70° C., and opaque resin composition was obtained.

ICI viscosity (@150° C.) and softening point of this resin composition were measured and shown in Table 2. Consequently, it became clear that the viscosity of the composition can be reduced.

Comparative Example 2

ICI viscosity (@150° C.) and softening point of epoxy 2 were measured, and the result was shown in Table 2.

Comparative Example 3

ICI viscosity (@150° C.) and softening point of epoxy 3 were measured, and the result was shown in Table 2.

Comparative example 4

Epoxy 1 and epoxy 2 were mixed as shown in Table 1, melt-mixed in a beaker at 150° C. and uniform resin composition was obtained. Then, this mixture was cooled rapidly, and confirmed by eye to form a transparent resin composition in which the amorphous epoxy resin and the crystalline epoxy resin are compatible.

ICI viscosity (@150° C.) and softening point of this resin composition were measured, and shown in Table 2. Consequently, it became clear that the softening point was lowered greatly.

TABLE 2

| | | Example | | | Comparative Example | | |
|---|---|---|---|---|---|---|---|
| | | 2 | 3 | 4 | 2 | 3 | 4 |
| Formulation | Epoxy 1 | 50 | 50 | — | — | — | 50 |
| | Epoxy 2 | 50 | — | 80 | 100 | — | 50 |
| | Epoxy 3 | — | 50 | — | — | 100 | — |
| | Epoxy 4 | — | — | 20 | — | — | — |
| Property | Softening point (° C.) | 92.9 | 88.3 | 68.6 | 88.1 | 48.4 | 55.8 |
| | ICI viscosity (P) | 0.7 | 0.25 | 1.03 | 2.7 | 0.8 | 0.7 |

Since the epoxy resin composition of the present invention has a high softening point as well as low melt viscosity, the blocking resistance and workability are improved greatly, which are problems in an amorphous epoxy resin of low melt viscosity. Moreover, the epoxy resin composition of the present invention has a good moldability even when the composition contains high amount of filler. This composition, as an encapsulating material for electronic device, has a good balance of properties, such as low moisture absorption, low elastic modulus (useful for lowering stress at the time of solder reflow) etc.

What is claimed is:

1. An epoxy resin composition comprising (A) a bifunctional crystalline epoxy compound, (B) an amorphous trisphenolmethane type epoxy compound having three or more of epoxy groups in a molecule, and (C) an epoxy curing agent having phenolic hydroxyl groups.

2. An epoxy resin composition according to claim 1, wherein the bifunctional crystalline epoxy compound (A) is represented by the general formula (1),

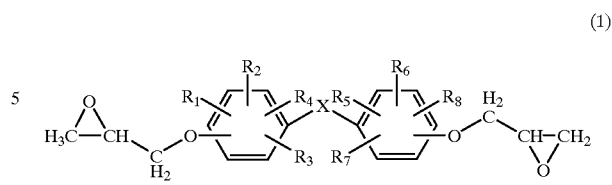

(1)

in the formula, X represents —N=N—, —CH=C($R_9$)—, —O—CO—, —CH=C(CN)—, —C≡C—, —CH=CH—CO— or a single bond; $R_1$ to $R_9$ represent each independently an acyclic or cyclic alkyl group having 1–6 carbon atoms, a hydrogen atom or a halogen atom.

3. An epoxy resin composition according to claim 1, which further comprises 40 to 95% by weight of an inorganic filler (D) based on the total amount of the whole resin composition.

4. A resin-encapsulated semiconductor device, wherein a semiconductor element is encapsulated with using the epoxy resin composition of in claim 1 or 2.

5. An epoxy resin composition comprising (A) a bifunctional crystalline epoxy compound, and (B) an amorphous trisphenolmethane type epoxy compound having three or more of epoxy groups in a molecule, wherein the whole or a part of the epoxy compound (A) is dispersed in the epoxy compound (B) as crystallites.

6. An epoxy resin composition according to claim 5, which further comprises ah epoxy curing agent (C).

7. A process for producing the epoxy resin composition of claim 5, which comprises mixing the epoxy compound (A) and the epoxy compound (B) with heating at a temperature of not lower than the melting point of (A) and not higher than the softening point of (B).

8. A process for producing the epoxy resin composition of claim 5, which comprises mixing the epoxy compound (A) and the epoxy compound (B) with heating at a temperature of not lower than the melting point of (A)cooling the resulting mixture to a temperature of not higher than the melting point of (A) to deposit the crystallites, and then kneading the mixture.

9. A process for producing the epoxy resin composition of claim 5, which comprises mixing the epoxy compound (A) and the epoxy compound (B) with heating at a temperature of not lower than the melting point of (A), and melt-kneading the resulting mixture with cooling to a temperature of not higher than the melting point of (A).

10. A resin-encapsulated semiconductor device, wherein a semiconductor element is encapsulated using the epoxy resin composition of claim 6.

* * * * *